(12) United States Patent
Shen

(10) Patent No.: US 10,021,775 B1
(45) Date of Patent: Jul. 10, 2018

(54) CIRCUIT BOARD AND FAN FRAME CONNECTION STRUCTURE

(71) Applicant: ASIA VITAL COMPONENTS CO., LTD., New Taipei (TW)

(72) Inventor: Meng Shen, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 0 days.

(21) Appl. No.: 15/627,399

(22) Filed: Jun. 19, 2017

(51) Int. Cl.
*H05K 1/00* (2006.01)
*H05K 1/02* (2006.01)
*H05K 7/20* (2006.01)
*G06F 1/20* (2006.01)

(52) U.S. Cl.
CPC .......... *H05K 1/0203* (2013.01); *G06F 1/203* (2013.01); *G06F 1/206* (2013.01); *H05K 7/20* (2013.01); *H05K 7/20136* (2013.01); *H05K 7/20145* (2013.01); *H05K 7/20172* (2013.01); *G06F 1/20* (2013.01); *G06F 2200/20* (2013.01); *G06F 2200/201* (2013.01); *H05K 7/20009* (2013.01); *H05K 7/20545* (2013.01); *H05K 7/20554* (2013.01)

(58) Field of Classification Search
None
See application file for complete search history.

(56) References Cited

U.S. PATENT DOCUMENTS

| 6,050,785 | A   | * | 4/2000  | Horng  | F04D 25/0613 |
|-----------|-----|---|---------|--------|--------------|
|           |     |   |         |        | 417/354      |
| 8,192,157 | B2  | * | 6/2012  | Horng  | F04D 29/646  |
|           |     |   |         |        | 415/200      |
| 8,506,264 | B2  | * | 8/2013  | Horng  | F04D 25/0606 |
|           |     |   |         |        | 310/52       |
| 2004/0257774 | A1 | * | 12/2004 | Lin   | F04D 29/38   |
|           |     |   |         |        | 361/719      |
| 2011/0255965 | A1 | * | 10/2011 | Chuang | F04D 25/0613 |
|           |     |   |         |        | 415/220      |
| 2012/0051940 | A1 | * | 3/2012  | Liu    | F04D 25/0613 |
|           |     |   |         |        | 416/247 R    |
| 2013/0064700 | A1 | * | 3/2013  | Wu     | F04D 17/16   |
|           |     |   |         |        | 417/423.7    |
| 2014/0341760 | A1 | * | 11/2014 | Chou   | F04D 25/0633 |
|           |     |   |         |        | 417/354      |

FOREIGN PATENT DOCUMENTS

| CN | 101605442 A | 12/2009 |
| CN | 102137581 A | 7/2011  |

* cited by examiner

*Primary Examiner* — Dimary Lopez Cruz
*Assistant Examiner* — Zhengfu Feng
(74) *Attorney, Agent, or Firm* — C. G. Mersereau; Nikolai & Mersereau, P.A.

(57) ABSTRACT

A circuit board and fan frame connection structure includes a fan frame, a circuit board and an adhesive member having multiple through holes. The fan frame includes a bottom board, a bearing cup disposed at the center of the bottom board and multiple perforations formed through the bottom board. The bottom board has an upper surface and a lower surface. The circuit board is adhered to the lower surface of the bottom board via the adhesive member. The electronic components arranged on the circuit board pass through the aligned through holes and perforations.

10 Claims, 10 Drawing Sheets

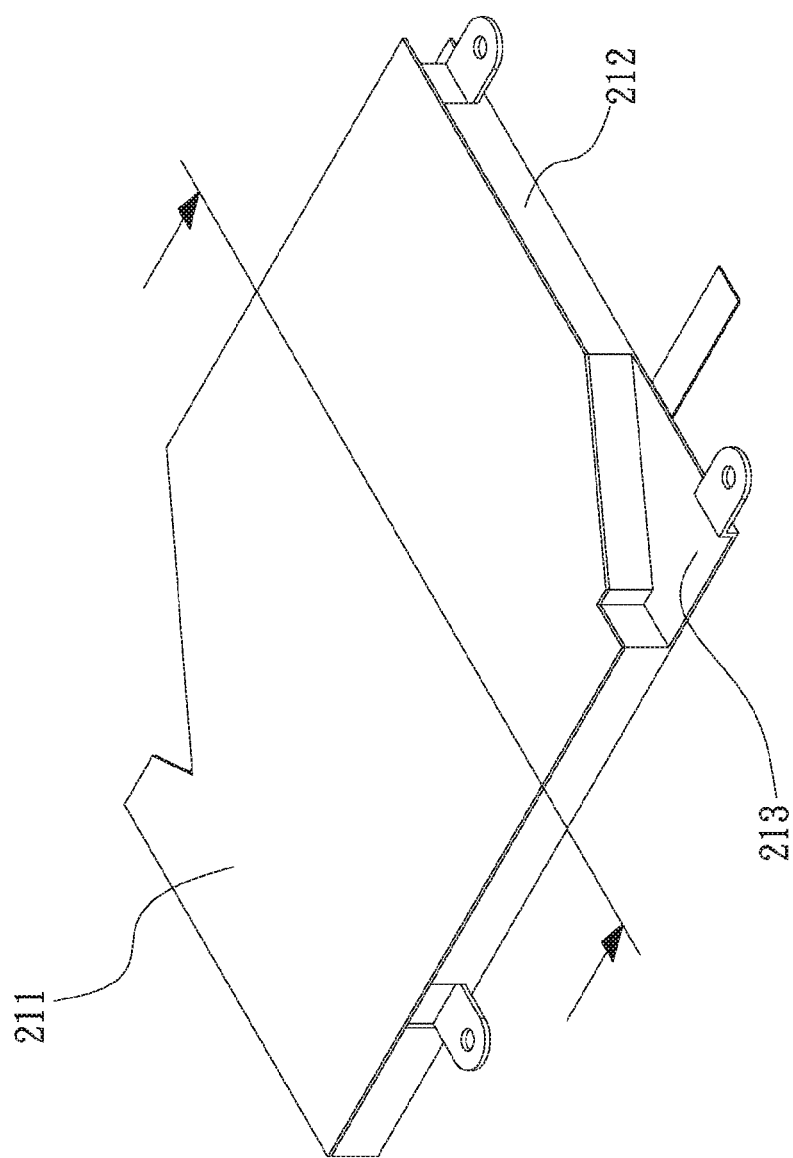

CIRCUIT BOARD AND FAN FRAME
CONNECTION STRUCTURE

BACKGROUND OF THE INVENTION

1. Field of the Invention

The present invention relates generally to a circuit board and fan frame connection structure, and more particularly to a circuit board and fan frame connection structure, which can save the internal space of the fan frame and increase the circuit layout space of the circuit board. In addition, the circuit board and fan frame connection structure can eliminate the problem of cocking of the circuit board.

2. Description of the Related Art

Along with the increasing advance of scientific and technical industries, various electronic devices, such as desktop computers, notebooks, intelligent mobile phones and tablets, have been more and more frequently and popularly used in our daily lives. These electronic devices generally include cooling fans for dissipating the heat.

FIG. 1 shows a conventional centrifugal fan 1 including a fan frame 11, a printed circuit board 12, a stator 13 and a fan impeller 14. The fan frame 11 has a top board 111, a sidewall 112, a bottom board 113 and a bearing cup seat 114. The bottom end of the sidewall 112 is connected with the outer periphery of the bottom board 113. The top board 111 is connected with the top end of the sidewall 112 to cover the same. An air inlet 15 is disposed on the top board 111 and an air outlet 16 is disposed on the sidewall 112. The printed circuit board 12 is arranged on the inner face of the bottom board 113 of the fan frame 11 in adjacency to the bearing cup seat 114. The bearing cup 1141 of the bearing cup seat 114 passes through a perforation 121 of the printed circuit board 12. The stator 13 is fitted around the bearing cup 1141 and positioned above the printed circuit board 12. The fan impeller 14 is received in the fan frame 11 and rotatably connected with the bearing cup 1141.

The printed circuit board 12 must be first formed with the perforation 121 corresponding to the bearing cup 1141. Therefore, the circuit layout space of the circuit board 12 is minified. Moreover, the conventional printed circuit board 12 is arranged on the inner face of the bottom board 113 of the fan frame 11 in such a manner that a pressing/attaching mold (not shown) applies a downward pressing force to the face of the printed circuit board 12 with the electronic components 17 so as to attach the printed circuit board 12 onto the inner face of the bottom board 113 of the fan frame 11. However, the electronic components 17 are not antipress and are easy to damage. Therefore, the electronic components 17 arranged on the printed circuit board 12 are often damaged due to the pressing force. Furthermore, the electronic components 17 respectively have different heights and sizes. Therefore, when the pressing/attaching mold presses the printed circuit board 12 downward, the pressing force can be hardly uniformly applied to the electronic components 17. As a result, the electronic components 17 are apt to damage and the printed circuit board 12 is hard to snugly attach and often has the problem of cocking. In addition, a space of the inner face of the bottom board 113 of the fan frame 11 in adjacency to the bearing cup 1141 must be reserved for the arrangement of the printed circuit board 12. As a result, the printed circuit board 12 will occupy the internal space of the fan frame 11.

SUMMARY OF THE INVENTION

It is therefore a primary object of the present invention to provide a circuit board and fan frame connection structure, which can save the internal space of the fan frame. In addition, when adhering/attaching the circuit board to the bottom board of the fan frame, the circuit board and fan frame connection structure can prevent the electronic components from being damaged.

It is a further object of the present invention to provide the above circuit board and fan frame connection structure, in which the circuit board is securely adhered to the lower surface of the bottom board of the fan frame via an adhesive member so that the problem of cocking of the circuit board is eliminated.

It is still a further object of the present invention to provide the above circuit board and fan frame connection structure, which can increase the circuit layout space of the circuit board.

To achieve the above and other objects, the circuit board and fan frame connection structure of the present invention includes a fan frame, a circuit board and an adhesive member. The fan frame includes a bottom board, a bearing cup and multiple perforations. The bottom board has an upper surface and a lower surface opposite to the upper surface. The bearing cup is disposed at a center of the bottom board. The perforations are formed through the bottom board between the upper and lower surfaces. The circuit board is disposed outside the fan frame. The circuit board has a circuit board main body and multiple electronic components. The circuit board main body faces the lower surface of the bottom board. The electronic components are arranged on the circuit board main body. The adhesive member is adhered to the lower surface of the bottom board and the circuit board main body and positioned between the bottom board of the fan frame and the circuit board main body. The adhesive member has multiple through holes formed through the adhesive member in alignment with and in communication with the perforations. The electronic components pass through the aligned through holes and perforations. According to the design of the connection structure of the present invention, the internal space of the fan frame can be saved and the circuit layout space of the circuit board is increased. In addition, the circuit board can be easily pressed and attached without damaging the electronic components. Moreover, the problem of cocking of the circuit board can be avoided.

In the above circuit board and fan frame connection structure, the circuit board main body has a top face and a bottom face opposite to the top face. The electronic components are arranged on the top face of the circuit board main body. The top face of the circuit board main body is adhered to the lower surface of the bottom board of the fan frame via the adhesive member.

In the above circuit board and fan frame connection structure, the adhesive member has a first adhesive face and a second adhesive face. The first adhesive face is adhered to the lower surface of the bottom board of the fan frame, while the second adhesive face is adhered to the top face of the circuit board main body. The electronic components are received in the through holes and the perforations.

In the above circuit board and fan frame connection structure, the adhesive member is adhesive glue or a thin sheet with adhesive glue.

In the above circuit board and fan frame connection structure, the fan frame includes a top board, a bottom board and a sidewall connected between the top board and the bottom board. The centers of the top board and the bottom board are respectively formed with an air inlet and an air outlet. The sidewall upward extends from the periphery of the bottom board. The sidewall and the bottom board define a receiving space in communication with the air inlet and the air outlet. The fan impeller is received in the receiving space. The fan impeller has a shaft and the bearing cup having a shaft hole corresponding to the shaft. The shaft is rotatably disposed in the shaft hole.

In the above circuit board and fan frame connection structure, the fan frame includes a sidewall upward extending from the outer periphery of the bottom board and a top board secured on the sidewall. The sidewall is formed with an air outlet and an air inlet. The sidewall and the bottom board define a receiving space in communication with the air outlet and the air inlet. The fan impeller is received in the receiving space. The fan impeller has a shaft and the bearing cup having a shaft hole corresponding to the shaft. The shaft is rotatably disposed in the shaft hole.

In the above circuit board and fan frame connection structure, the circuit board main body is a hard printed circuit board or a flexible printed circuit board.

In the above circuit board and fan frame connection structure, the electronic components are arranged on the circuit board in a position in alignment with the positions of the perforations and the through holes.

In the above circuit board and fan frame connection structure, the through holes have an area larger than the area of the electronic components and the perforations have an area larger than the area of the electronic components and the perforations have a size equal to the size of the through holes.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 5A is a perspective assembled view of the first embodiment of the present invention, showing that the circuit board and fan frame connection structure of the present invention is applied to a fan;

DETAILED DESCRIPTION OF THE PREFERRED EMBODIMENTS

Figure 1:
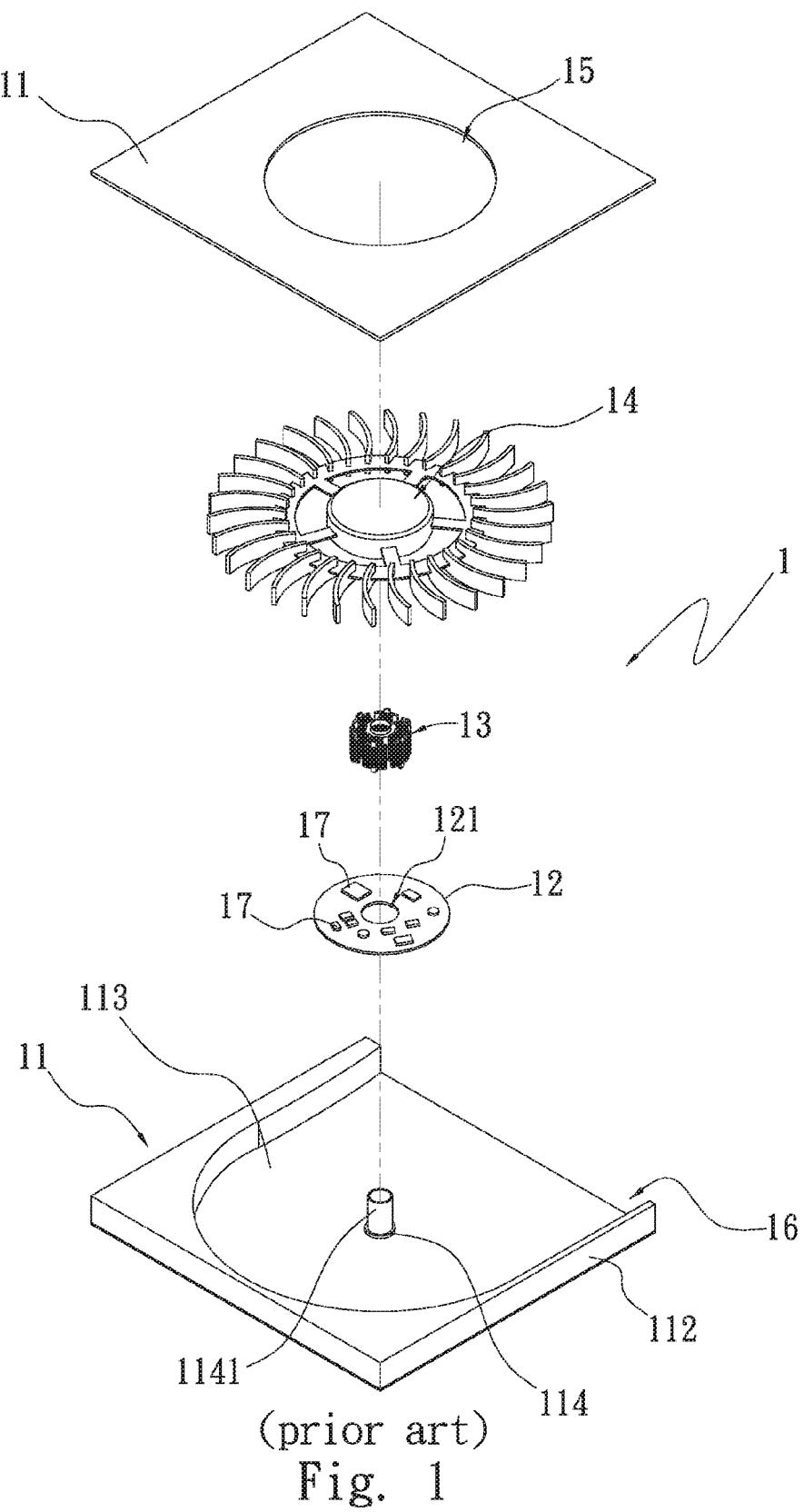
FIG. 1 is a perspective exploded view of a conventional centrifugal fan.
Figure 2:
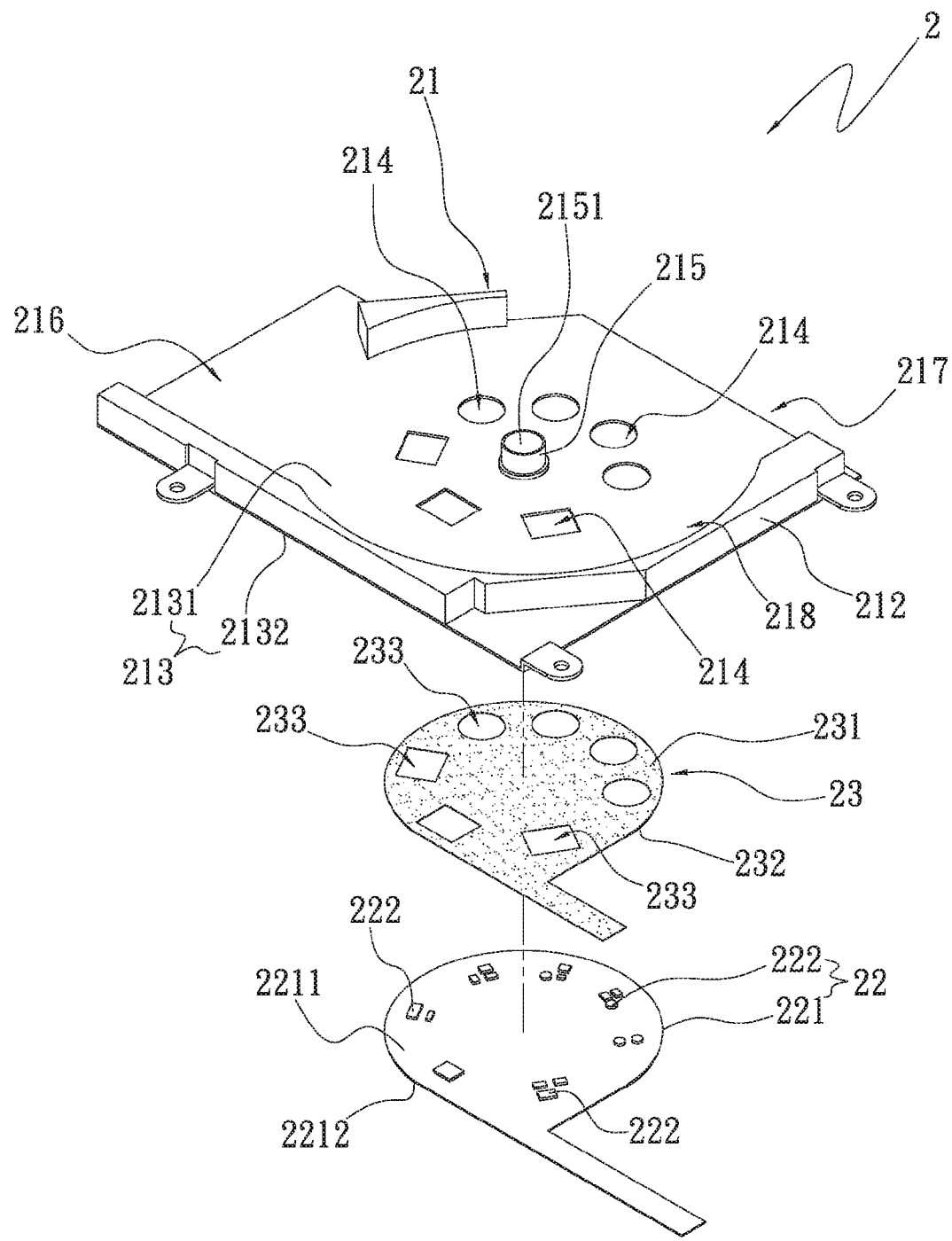
FIG. 2 is a perspective exploded view of a first embodiment of the present invention.
Figure 3:
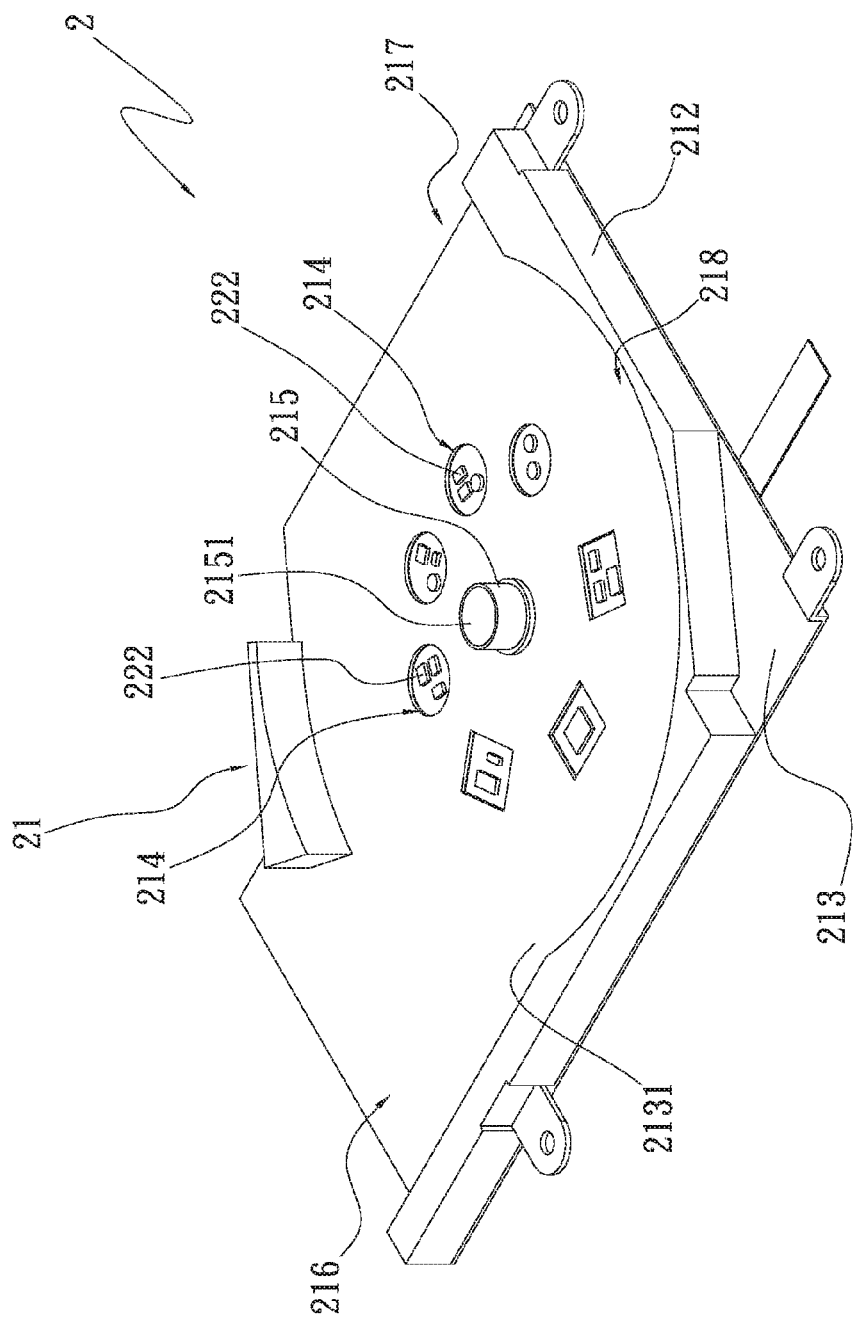
FIG. 3 is a perspective assembled view of the first embodiment of the present invention.
Figure 4:
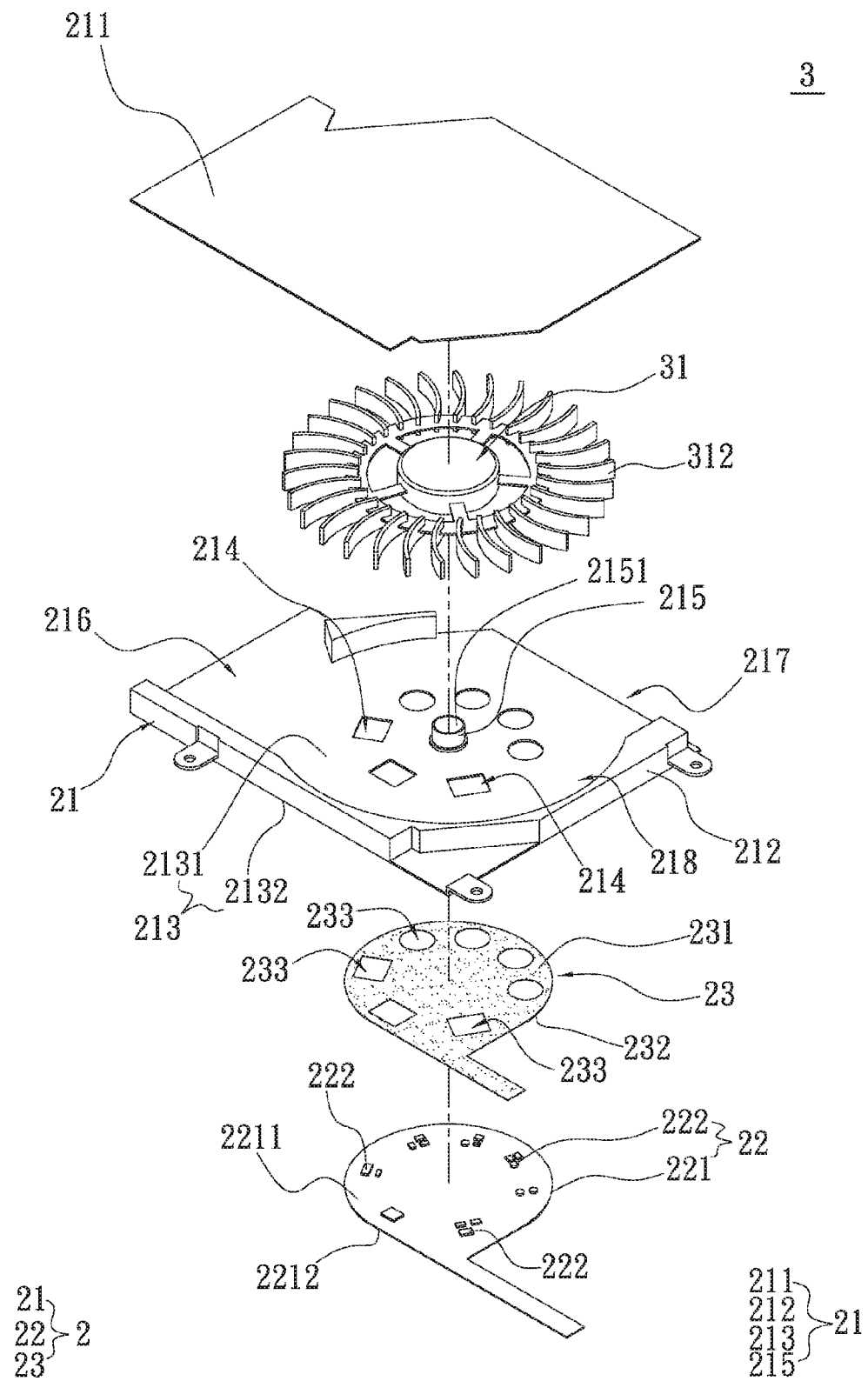
FIG. 4 is a perspective exploded view of the first embodiment of the present invention, showing that the circuit board and fan frame connection structure of the present invention is applied to a fan.
Figure 5B:
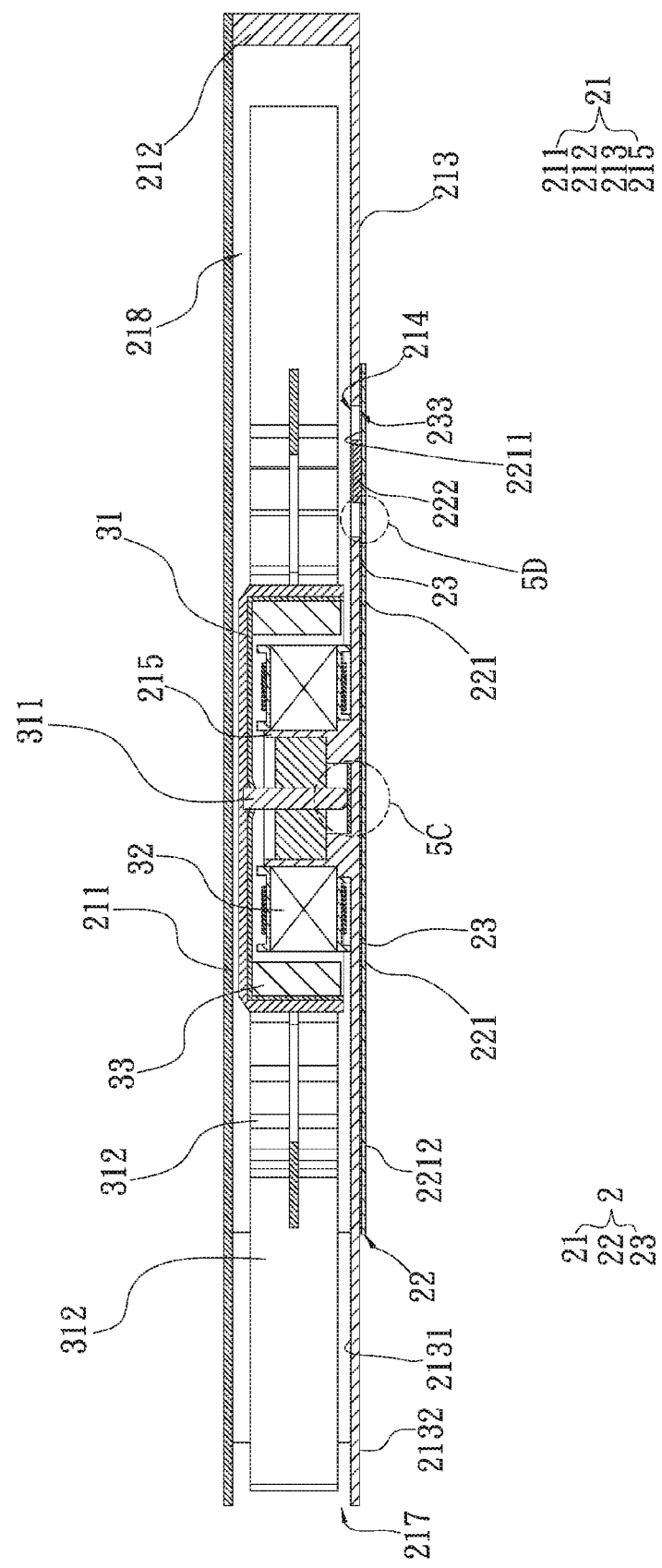
FIG. 5B is a sectional assembled view according to FIG. 5A.

Please refer to FIGS. 2 and 3. FIG. 2 is a perspective exploded view of a first embodiment of the present invention. FIG. 3 is a perspective assembled view of the first embodiment of the present invention. Also, please supplementally refer to FIGS. 4, 5A and 5B. The circuit board and fan frame connection structure 2 of the present invention is applied to a fan 3. In this embodiment, the fan 3 is, but not limited to, a centrifugal fan. In practice, the fan 3 can be alternatively an axial-flow fan or other fan. The fan 3 includes the circuit board and fan frame connection structure 2 and a fan impeller 31 having multiple blades 312. The circuit board and fan frame connection structure 2 includes a fan frame 21, a circuit board 22 and an adhesive member 23. The fan frame 21 includes a bottom board 213, a sidewall 212, a top board 211, a bearing cup 215 disposed at the center of the bottom board 213 and multiple perforations 214. The sidewall 212 upward extends from the outer periphery of the bottom board 213. The top board 211 is secured on the sidewall 212 to cover the same. The sidewall 212 is formed with an air outlet 217 and an air inlet 216. The sidewall 212 and the bottom board 213 define a receiving space 218 in communication with the air outlet 217 and the air inlet 216. The fan impeller 31 is received in the receiving space 218. The fan impeller 31 has a shaft 311 and the bearing cup 215 has a shaft hole 2151 corresponding to the shaft 311. The shaft 311 is rotatably disposed in the shaft hole 2151. A stator 32 is fitted around the bearing cup 215. A magnetic member 33 (such as a magnet) is disposed in the fan impeller 31, whereby the stator 32 is magnetized to drive the fan impeller 31 to rotate.

The bottom board 213 has an upper surface 2131 and a lower surface 2132 opposite to the upper surface 2131. The upper surface 2131, (that is, the inner face of the bottom board 213) is positioned in the receiving space 218. The lower surface 2132, (that is, the outer face of the bottom board 213) is positioned outside the receiving space 218. The perforations 214 are formed through the bottom board 213 between the upper and lower surfaces 2131, 2132. The circuit board 22 is disposed outside the fan frame 21. The circuit board 22 has a circuit board main body 221 and multiple electronic components 222. In this embodiment, the circuit board main body 221 is, but not limited to, a flexible printed circuit board. In practice, the circuit board main body 221 can be alternatively a hard printed circuit board. The circuit board main body 221 faces the lower surface 2132 of the bottom board 213. The circuit board main body 221 has a top face 2211 and a bottom face 2212 opposite to the top face 2211. The bottom face 2212 is a plane face free from any electronic component 222. The electronic components 222 are arranged on the top face 2211 of the circuit board main body 221 in a position in alignment with the position of the perforations 214. The perforations 214 have an area larger than the area of the electronic components 222.

Figure 5C:
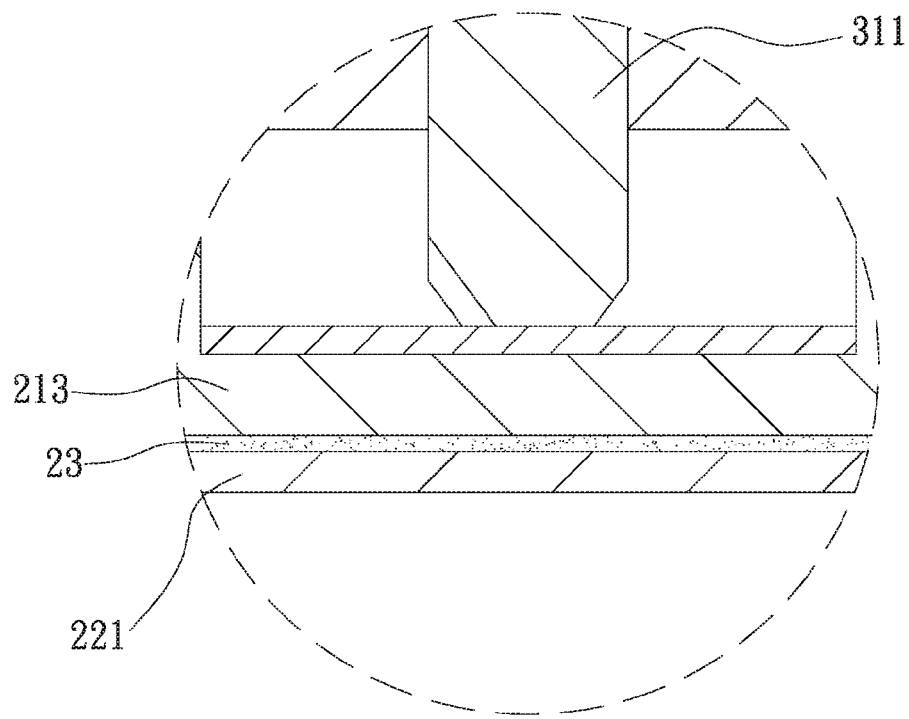
FIG. 5C is an enlarged view of circled area 5C of FIG. 5B.
Figure 5D:
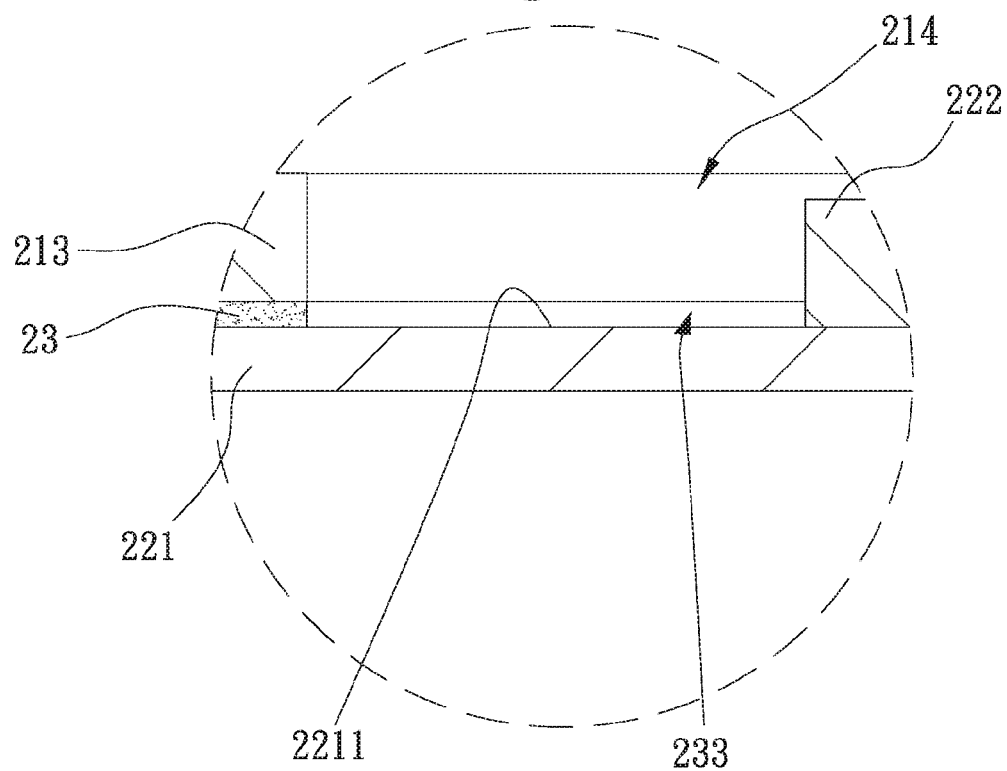
FIG. 5D is an enlarged view of circled area 5D of FIG. 5B.

The adhesive member 23 can be adhesive glue or a thin sheet with adhesive glue. In this embodiment, the adhesive member 23 is a thin sheet with adhesive glue for illustration purposes. The adhesive member 23 is adhered to the lower surface 2132 of the bottom board 213 and the circuit board main body 221 and positioned between the bottom board 213 of the fan frame 21 and the circuit board main body 221. The adhesive member 23 has a first adhesive face 231, a second adhesive face 232 and multiple through holes 233. The first adhesive face 231 is adhered to the lower surface 2132 of the bottom board 213 of the fan frame 21, while the second adhesive face 232 is adhered to the top face 2211 of the circuit board main body 221. The through holes 233 are formed through the adhesive member 23 between the first and second adhesive faces 231, 232 in alignment with and in communication with the perforations 214. Accordingly, the top face 2211 of the circuit board main body 221 is adhered to the lower surface 2132 of the bottom board 213 of the fan frame 21 via the adhesive member 23 with the electronic components 222 passing through the through holes 233 and the perforations 214. The electronic components 222 are received in the through holes 233 and the perforations 214 (as shown in FIGS. 5C and 5D). In addition, the electronic components 222 are arranged on the top face 2211 of the circuit board main body 221 in a position in alignment with the position of the through holes 233. The through holes 233 have an area larger than the area of the electronic components 222. The perforations 214 have a size equal to the size of the through holes 233.

Therefore, when the circuit board 22 is to be securely attached to the outer side of the fan frame 21, the first adhesive face 231 of the adhesive member 23 is adhered to the lower surface 2132 of the bottom board 213. Then, a pressing/attaching mold (or a user) applies a pressing force to the bottom face 2212 of the circuit board main body 221 to press the circuit board 22 against the lower surface 2132 of the bottom board 213 of the fan frame 21. At this time, the electronic components 222 on the circuit board main body 221 will sequentially pass through the corresponding through holes 233 and the perforations 214 and the second adhesive face 232 of the adhesive member 23 is adhered to the top face 2211 of the circuit board main body 221. Accordingly, the adhesive member 23 can be uniformly adhered between the bottom board 213 and the circuit board main body 221, whereby the second adhesive face 232 is adhered to the top face 2211 of the circuit board main body 221 can be securely adhered to the outer face of the bottom board 213 of the fan frame 21 with one end of the electronic components 222 extending through the perforations 214 and protruding from the upper surface 2131 of the bottom board 213.

According to the design of the connection structure of the present invention, the internal space of the fan frame 21 can be saved and the circuit layout space of the circuit board 22 is increased. In addition, the circuit board 22 can be easily pressed and attached without damaging the electronic components 222. Moreover, the problem of cocking of the circuit board 22 can be avoided.

Figure 6:
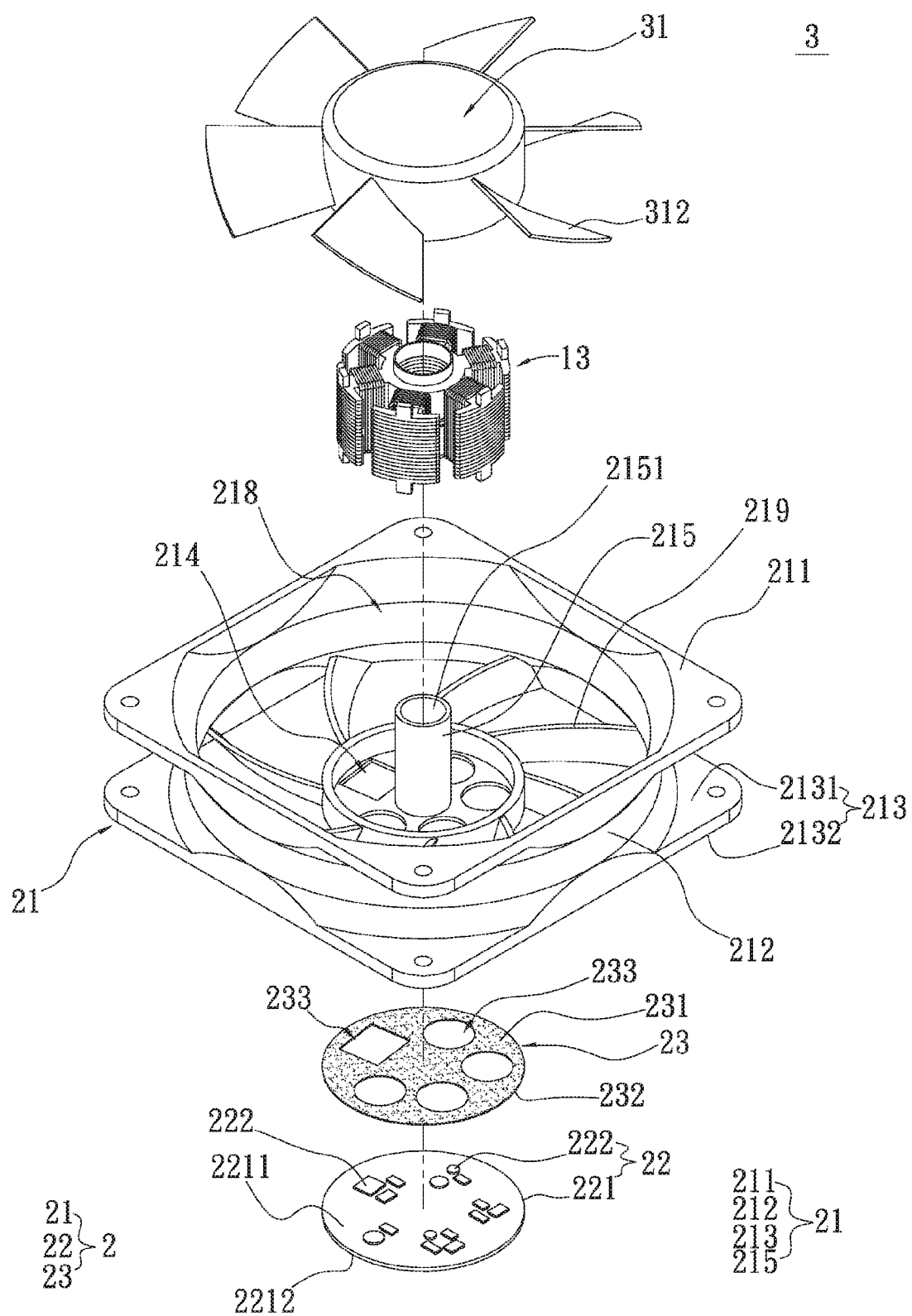
FIG. 6 is a perspective exploded view of a second embodiment of the present invention, showing that the circuit board and fan frame connection structure of the present invention is applied to an axial-flow fan.
Figure 7:
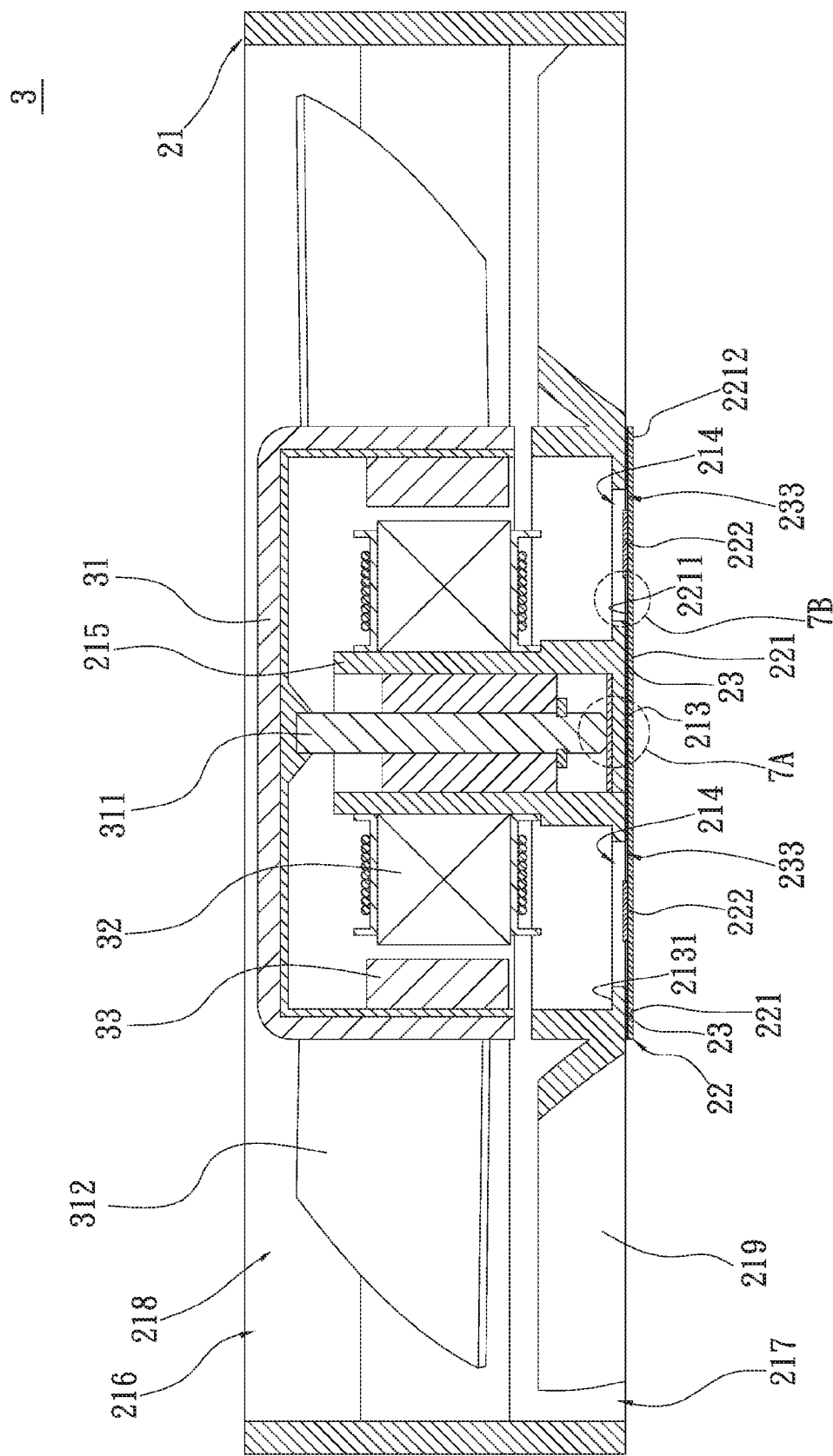
FIG. 7 is a sectional assembled view of the second embodiment of the present invention, showing that the circuit board and fan frame connection structure of the present invention is applied to an axial-flow fan.
Figure 7A:
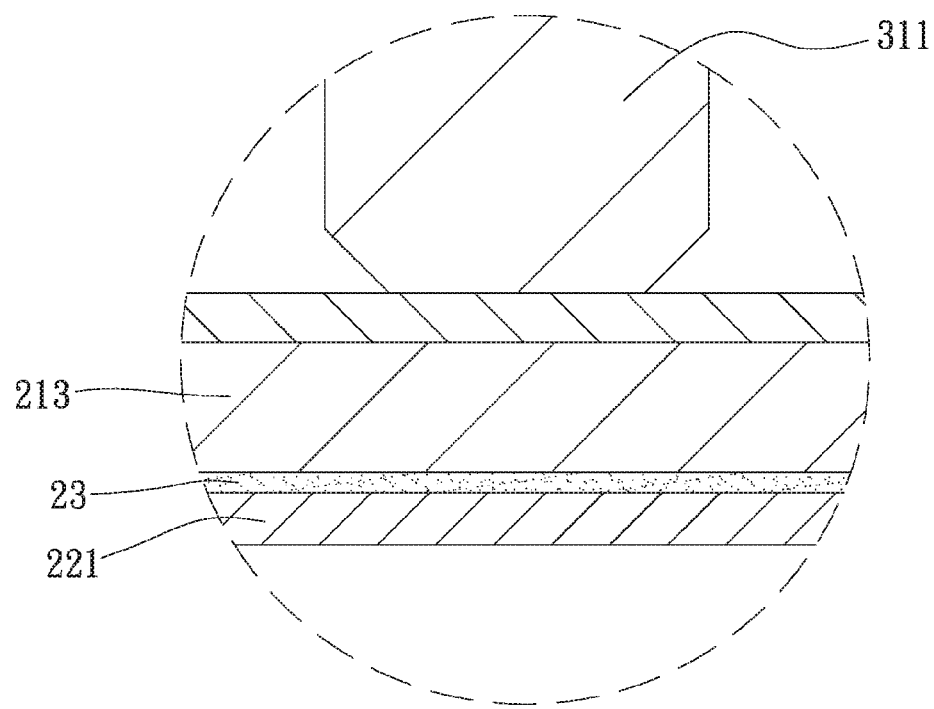
FIG. 7A is an enlarged view of circled area 7A of FIG. 7.
Figure 7B:
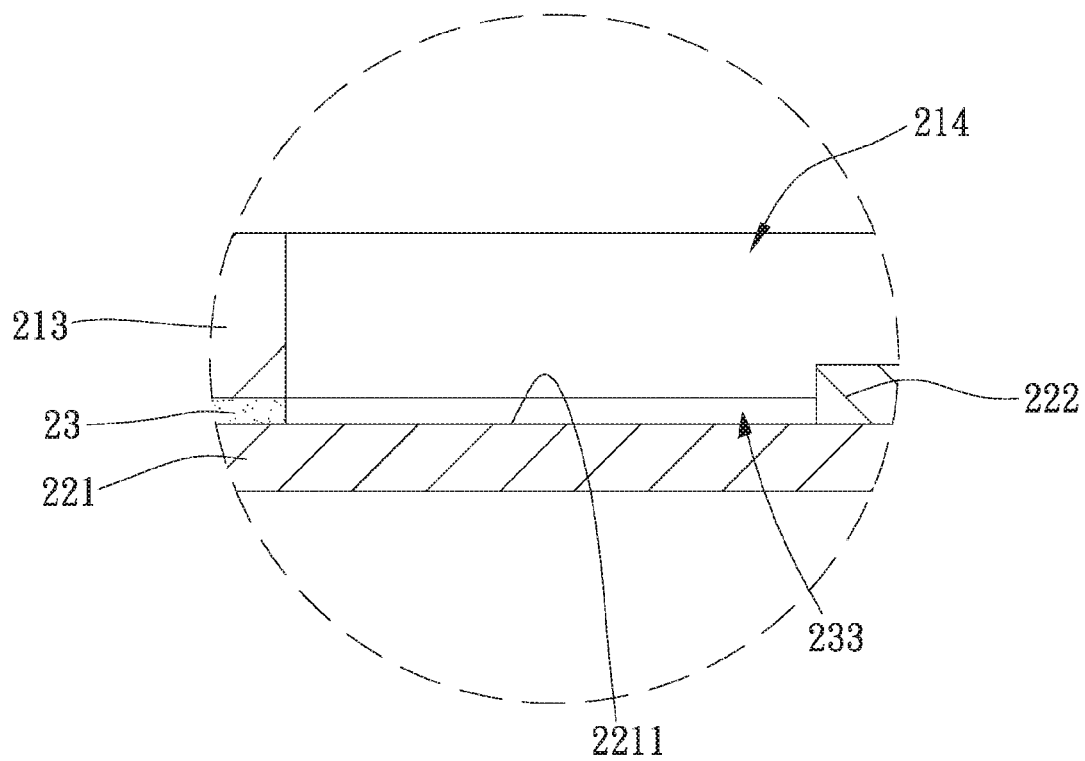
FIG. 7B is an enlarged view of circled area 7B of FIG. 7.

Please now refer to FIGS. 6 and 7 and supplementally to FIGS. 7A and 7B. FIG. 6 is a perspective exploded view of a second embodiment of the present invention, showing that the circuit board and fan frame connection structure of the present invention is applied to an axial-flow fan. FIG. 7 is a sectional assembled view of the second embodiment of the present invention, showing that the circuit board and fan frame connection structure of the present invention is applied to an axial-flow fan. In the second embodiment, the circuit board and fan frame connection structure 2 of the present invention is applied to an axial-flow fan instead of the centrifugal fan. That is, the fan 3 includes the circuit board and fan frame connection structure 2 and a fan impeller 31 having multiple blades 312. The second embodiment is substantially identical to the first embodiment in structure and connection relationship and thus will not be repeatedly described hereinafter. The second embodiment is different from the first embodiment in that the fan frame 21 includes a top board 211, a bottom board 213, a sidewall 212 connected between the top board 211 and the bottom board 213 and multiple ribs 219. The centers of the top board 211 and the bottom board 213 are respectively formed with an air inlet 216 and an air outlet 217. The sidewall 212 upward extends from the periphery of the bottom board 213. The sidewall 212, the bottom board 213 and the top board 211 together define a receiving space 218 in communication with the air inlet 216 and the air outlet 217. The fan impeller 31 is received in the receiving space 218. The fan impeller 31 has a shaft 311 and the bearing cup 215 has a shaft hole 2151 corresponding to the shaft 311. The shaft 311 is rotatably disposed in the shaft hole 2151. The bearing cup 215 is disposed at the center of the bottom board 213 and positioned at the air outlet 217. The bearing cup 215 is connected to the bottom board 213 via the ribs 219 that outward extend from the bearing cup 215. A stator 32 is fitted around the bearing cup 215. A magnetic member 33 (such as a magnet) is disposed in the fan impeller 31, whereby the stator 32 is magnetized to drive the fan impeller 31 to rotate.

According to the design of the connection structure of the present invention, the internal space of the fan frame 21 can be saved and the circuit layout space of the circuit board 22 is increased. In addition, the circuit board 22 can be easily pressed and attached without damaging the electronic components 222. Moreover, the problem of cocking of the circuit board 22 can be avoided.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A circuit board and fan frame connection structure comprising:
    a fan frame including a bottom board, a bearing cup and multiple perforations, the bottom board having an upper surface and a lower surface opposite to the upper surface, the bearing cup being disposed at a center of the bottom board, the perforations being formed through the bottom board between the upper and lower surfaces;
    a circuit board disposed outside the fan frame, the circuit board having a circuit board main body and multiple electronic components, the circuit board main body facing the lower surface of the bottom board, the electronic components being arranged on the circuit board main body; and
    an adhesive member adhered to the lower surface of the bottom board and the circuit board main body and positioned between the bottom board of the fan frame and the circuit board main body, the adhesive member having multiple through holes formed through the adhesive member in alignment with and in communication with the perforations, the electronic components passing through the aligned through holes and perforations.

2. The circuit board and fan frame connection structure as claimed in claim 1, wherein the circuit board main body has a top face and a bottom face opposite to the top face, the electronic components being arranged on the top face of the circuit board main body, the top face of the circuit board main body being adhered to the lower surface of the bottom board of the fan frame via the adhesive member.

3. The circuit board and fan frame connection structure as claimed in claim 2, wherein the adhesive member has a first adhesive face and a second adhesive face, the first adhesive face being adhered to the lower surface of the bottom board of the fan frame, while the second adhesive face being adhered to the top face of the circuit board main body, the electronic components being received in the through holes and the perforations.

4. The circuit board and fan frame connection structure as claimed in claim 1, wherein the adhesive member is adhesive glue or a thin sheet with adhesive glue.

5. The circuit board and fan frame connection structure as claimed in claim 1, wherein the fan frame includes a top board, a bottom board and a sidewall connected between the top board and the bottom board, the centers of the top board and the bottom board being respectively formed with an air inlet and an air outlet, the sidewall upward extending from the periphery of the bottom board, the sidewall and the bottom board defining a receiving space in communication with the air inlet and the air outlet, the fan impeller being received in the receiving space, the fan impeller having a shaft and the bearing cup having a shaft hole corresponding to the shaft, the shaft being rotatably disposed in the shaft hole.

6. The circuit board and fan frame connection structure as claimed in claim 1, wherein the fan frame includes a sidewall upward extending from the outer periphery of the bottom board and a top board secured on the sidewall, the sidewall being formed with an air outlet and an air inlet, the sidewall and the bottom board defining a receiving space in communication with the air outlet and the air inlet, the fan impeller being received in the receiving space, the fan impeller having a shaft and the bearing cup having a shaft hole corresponding to the shaft, the shaft being rotatably disposed in the shaft hole.

7. The circuit board and fan frame connection structure as claimed in claim 1, wherein the circuit board main body is a hard printed circuit board or a flexible printed circuit board.

8. The circuit board and fan frame connection structure as claimed in claim 1, wherein the electronic components are arranged on the circuit board in a position in alignment with the positions of the perforations and the through holes.

9. The circuit board and fan frame connection structure as claimed in claim 1, wherein the through holes have an area larger than the area of the electronic components and the perforations have an area larger than the area of the electronic components.

10. The circuit board and fan frame connection structure as claimed in claim 1, wherein the perforations have a size equal to the size of the through holes.

* * * * *